United States Patent [19]

Chaki et al.

[11] 4,269,074
[45] May 26, 1981

[54] CHANGEOVER MECHANISM FOR PUSHBUTTON TUNER

[76] Inventors: Takao Chaki; Chuji Akasaka, both of 50 Kamitoda, Toda-shi, Saitama-ken, Japan

[21] Appl. No.: 45,068

[22] Filed: Jun. 4, 1979

[30] Foreign Application Priority Data

Jun. 6, 1978 [JP] Japan ............................ 53-76152[U]

[51] Int. Cl.³ .............................................. H03J 5/12
[52] U.S. Cl. ...................................... 74/10.33; 334/7
[58] Field of Search ................. 74/10.27, 10.33, 10.37; 334/7

[56] References Cited

U.S. PATENT DOCUMENTS

| | | | |
|---|---|---|---|
| 3,415,129 | 12/1968 | Stamm | 74/10.33 |
| 3,463,017 | 8/1969 | Stamm et al. | 334/7 X |
| 3,646,821 | 3/1972 | Clark | 74/10.33 |
| 3,722,299 | 3/1973 | Knight | 334/7 X |
| 3,995,242 | 11/1976 | Chaki | 74/10.33 X |
| 4,003,266 | 1/1977 | Yamagishi | 334/7 X |
| 4,010,652 | 3/1977 | Sugimoto et al. | 334/7 X |
| 4,079,631 | 3/1978 | Chaki | 334/7 X |

Primary Examiner—Allan D. Herrmann

[57] ABSTRACT

A changeover mechanism for a multi-band pushbutton tuner in which a plurality of button slides with push buttons secured thereto, respectively, have each a pair of auxiliary slide members disposed on opposite sides thereof, lock members are mounted on pivotal seats of the button slides so as to rock thereon, respectively, and a changeover plate has operative portions which are engageable with cam portions formed on the respective upper edges of the lock members, to change over the position of the lock members relative to the button slides by displacement of the changeover plate, which mechanism is characterized in that the changeover plate is provided with an operative projection which is engageable with an operative member rotatably mounted on a support frame provided over an area where the push buttons are disposed, the operative member is engageable, at opposite ends thereof, with interlocking links, respectively, and the interlocking links are connected to push-actuators provided on opposite ends of the support frame, respectively.

5 Claims, 4 Drawing Figures

CHANGEOVER MECHANISM FOR PUSHBUTTON TUNER

TECHNICAL FIELD

This invention relates to a changeover mechanism for a pushbutton tuner, and more particularly to a changeover mechanism for a multi-band pushbutton tuner which is capable of providing an easy and accurate operation and capable of achieving a changeover operation of receiving bands smoothly with a small force.

There is in general used today, a multi-band pushbutton tuner wherein plural receiving bands can be selected by each of a series of push buttons arranged along the front of the tuner. This pushbutton tuner has a plurality of auxiliary slide members for to each of an array of button slides to which the push buttons are secured, respectively, and lock members mounted on the respective button slides and rockable to change engagement between the button slides and the auxiliary slide members associated therewith respectively. This type of multi-band pushbutton tuner, however, has shortcomings in the operability of the changeover mechanism. More specifically, in the aforesaid conventional multi-band pushbutton tuner, the changeover operation is carried out by laterally displacing, by an actuator projection provided intermediate the array of the push buttons, a changeover plate having a plurality of operative portions which are adapted to abut on cammed portions of the respective lock members. Mechanical difficulties are sometimes encountered because the operating direction of the actuator projections is different from the button slides and the actuator projection is located adjacently to the array of the button projection.

SUMMARY OF THE INVENTION

It is therefore an object of the present invention to provide a changeover mechanism for a multi-band pushbutton tuner which can easily achieve a changeover operation by operating an actuator in the same direction as of the button slides.

In accordance with the present invention, there is provided a changeover mechanism for a pushbutton tuner comprising:

a plurality of button slides having each a push button secured at one end of the respective button slide;

auxiliary slide members disposed on oppsite sides of each of the button slides;

lock members pivotally mounted on the button slides to rock thereon, respectively;

a changeover member adapted to engage the lock members and displaceable to change over the relationship between said lock members and said changeover member;

an operative member adapted to engage the changeover member and rotatable to displace said changeover member; and operating means adapted to engage either one of the opposite ends of the operative member to rotate said operative member for the displacement of the changeover member.

PREFERRED EMBODIMENT OF THE INVENTION

Figure 1:
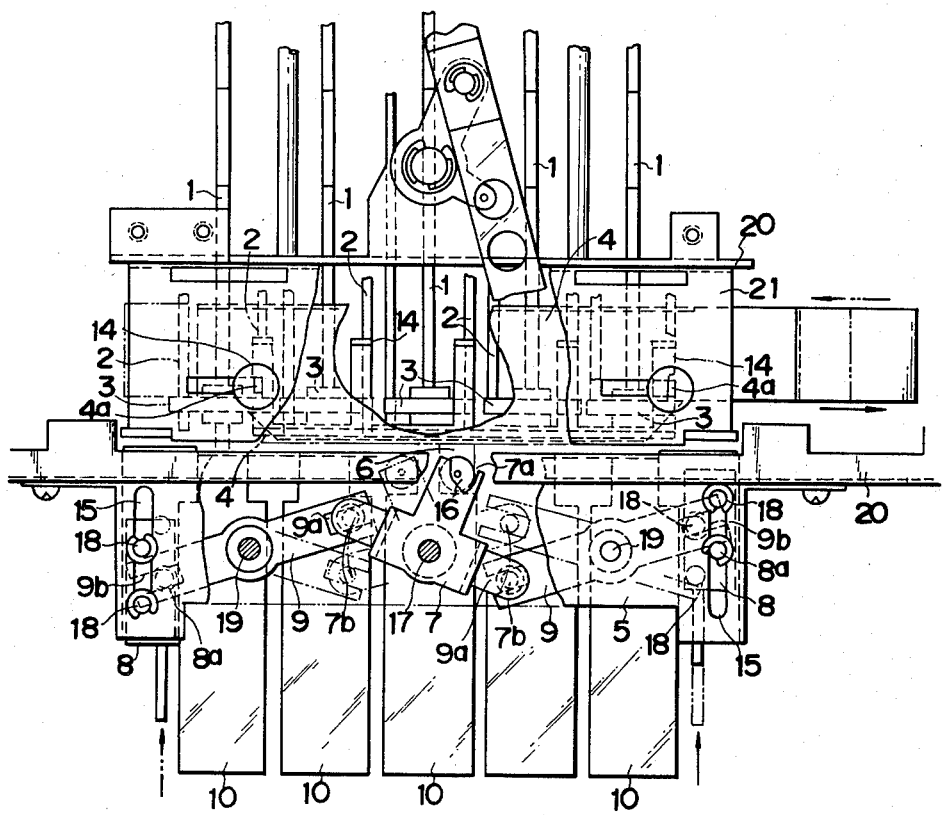
FIG. 1 is a partly cutaway plan view of a main part of the multi-band pushbutton tuner provided with the changeover mechanism according to the invention.
Figure 2A:
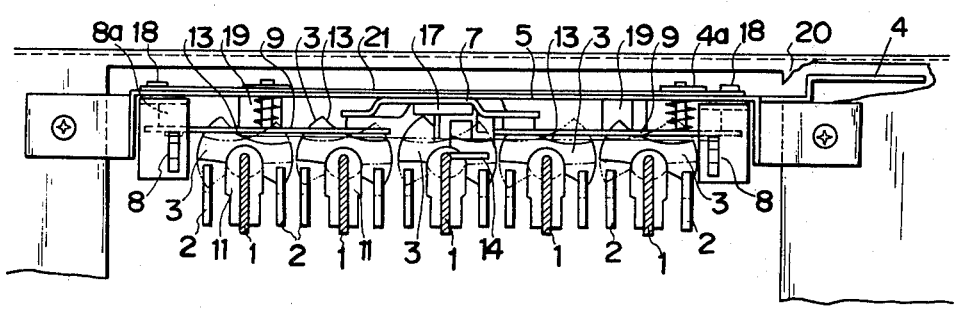
FIG. 2A is a cross sectional front view of the tuner shown in FIG. 1.
Figure 2B:
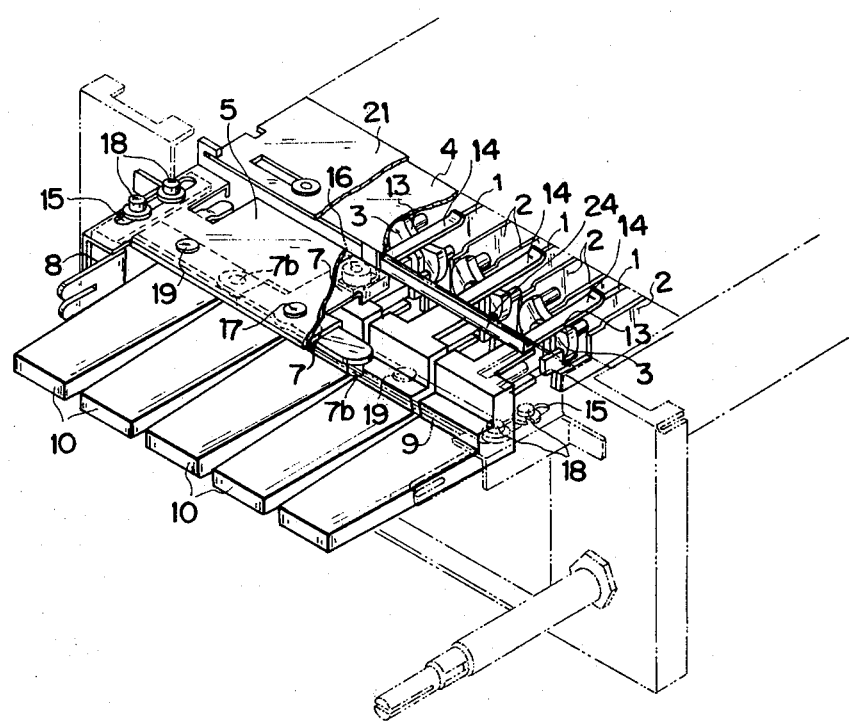
FIG. 2B is a perspective view of the tuner.

Referring now to the drawings, there is illustrated a preferred embodiment of the invention. As illustrated in FIGS. 1, 2A and 2B, push buttons 10 are fixed to button slides 1, respectively, and auxiliary slide members 2, 2 are disposed on opposite sides of each of the button slides 1. The button slides 1 each have pivotal seats 11, respectively, and the lock members 3 are mounted on the pivotal seats 11, respectively, so as to rock thereon. Each lock member 3 has a cam portion 13 on an upper edge thereof. On each cam portion 13, there abuts an operative portion 14 provided on a member 24 which is provided on a changeover plate 4. The changeover plate 4 is displaceable laterally relative to an apparatus frame 20. A support frame 5 is provided above an area where the push buttons 10 are disposed. An operative projection 6 having a roller 16 is formed intermediate the changeover plate 4. The operative projection 6 is engageable with an engaging projection 7a of a T-shaped operative member 7 which is pivotally mounted by a first shaft 17 on the support frame 5. The support frame 5 has, at opposite ends thereof, a pair of push-actuators 8, 8. Between the push-actuators 8, 8 and opposite ends of the operative member 7 are interposed interlocking links 9, 9 pivotally mounted by second shafts 19 on the support frame 5, respectively. In the embodiment as illustrated, engaging pins 7b are provided on the opposite ends of the operative member 7, respectively and engaged with groove 9a formed at the inner ends of the respective interlocking links 9. The interlocking links 9 further have grooves 9b at the outer ends thereof, respectively, which are engaged with engaging pins 8a of the push-actuators 8, respectively. The push-actuators 8 are slidable relative to elongated slots 15 formed at the opposite ends of the support frame 5 for example through engaging pins 18 and E rings.

Figure 3:
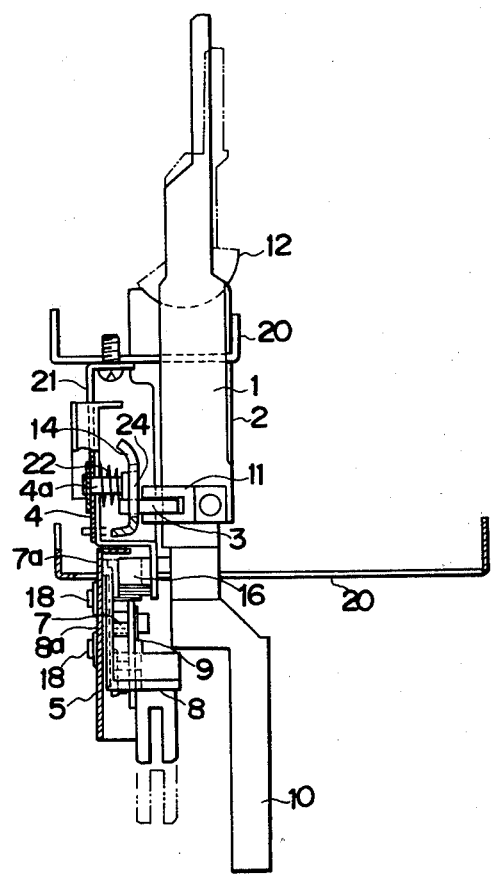
FIG. 3 is a longitudinal sectional side view of the tuner shown in FIG. 1.

As can be seen from FIG. 3, a frequency control member 12 is disposed on each auxiliary slide member 2 so that the setting angle thereof may be changed or adjusted. The frequency control member 12 is pushed conjointly with the button slide 1 when the latter is depressed inwardly, to actuate a rotary crank provided on the apparatus frame 20 for effecting station selection. The member 24 having the operative portion 14 is fixed to an upper plate 21 FIG. 1 of the apparatus frame 20 together with the changeover plate 4 at a connecting portion 4a through a resilient member 22. With this arrangement, the changeover operation by rocking of the lock member 3 can be effected smoothly. However, the operative portion 14 may of course be formed directly on the changeover plate 4.

The operation of the mechanism in accordance with the invention is as illustrated in FIG. 1. When either one of the push-actuators 8 is depressed, the operative member 7 is rotated around 17 through the interlocking link 9 associated with said push-actuator 8. The engaging projection 7a then causes the changeover plate 4 to displace and causes the lock member 3 to rock so as to change over the operational relationships between the button slide 1 and the slide members 2. Simultaneously, the other push-actuator 8 which has been depressed through the other interlocking member 9 is reset to a standby position for next depression. These operations may be repeated to change over the receiving bands from AM to FM or vice versa, depending upon the push-actuator depressed and attain selection of desired station in AM or FM.

In accordance with the invention as described above, since the operation for changing over the bands is carried out by the push-actuators 8 which are adapted to move in the same direction as of the push buttons 10, such disadvantages are alleviated as are involved in the conventional mechanism where the actuator projection difficult to hold by hand must be operated laterally. In addition, since a relatively large space above the area where the push buttons are disposed can be used for disposing the interlocking links 9 and the operative member 7, the length ratio of the components can be selected freely. Consequently, the pushing force to act on the push-actuator 8 may be suitably selected and, therefore, the changeover operation can be accomplished by a force as small as for example substantially the same as the force required for pushing each of the push buttons 10. Thus, there can be realized a changeover operation suitable for a pushbutton tuner of this type in which a light-touch operation is highly desired. Furthermore since the mechanism is formed only by providing the aforesaid components on the support frame 5 in association with the operative projection 6 of the changeover plate 4, the mechanism can be readily applied to an existing multi-band pushbutton tuner and it does not require any change or modification in fabrication steps and operation of the multi-band pushbutton tuner which reduces manufacturing costs.

We claim:

1. A changeover mechanism for a pushbutton tuner comprising;
   a plurality of button slides having each a push button secured at one end of the respective button slide;
   auxiliary slide members disposed on opposite sides of each of the button slides;
   lock members pivotally mounted on the button slides to rock thereon, respectively;
   a changeover member adapted to engage the lock members and displaceable to change over the relationship between said lock members and said changeover member;
   an operative member adapted to engage the changeover member and rotatable to displace said changeover member; and
   operating means adapted to engage either one of opposite ends of the operative member to rotate said operative member for the displacement of the changeover member.

2. A changeover mechanism as set forth in claim 1, wherein said operating means comprises interlocking links adapted to engage the opposite ends of the operative member respectively, and push-actuators connected to the interlocking links, respectively and operating in the same direction as the said button slides.

3. A changeover mechanism as set forth in claim 1, wherein said changeover member has an operative projection which is adapted to engage said operative member.

4. A changeover mechanism as set forth in claim 1, which further comprises a support frame provided in the vicinity of an area where the push buttons are disposed, for rotatably mounting said operative member thereon.

5. A changeover mechanism as set forth in claim 2, which further comprises a support frame provided in the vicinity of an area where the push buttons are disposed and having opposite ends at which said push-actuators are disposed, respectively.

* * * * *